United States Patent
Reiss

(10) Patent No.: US 10,267,479 B2
(45) Date of Patent: Apr. 23, 2019

(54) LIGHT MODULE WITH REDUCED BULK

(71) Applicant: VALEO VISION, Bobigny (FR)

(72) Inventor: Benoit Reiss, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/900,074

(22) Filed: Feb. 20, 2018

(65) Prior Publication Data

US 2018/0238514 A1  Aug. 23, 2018

(30) Foreign Application Priority Data

Feb. 17, 2017 (FR) .................................... 17 51283

(51) Int. Cl.
| | |
|---|---|
| *F21V 29/00* | (2015.01) |
| *F21S 43/19* | (2018.01) |
| *H01L 33/64* | (2010.01) |
| *F21S 41/19* | (2018.01) |
| *F21S 41/663* | (2018.01) |
| *F21S 43/33* | (2018.01) |
| *F21S 45/47* | (2018.01) |
| *F21S 43/14* | (2018.01) |
| *H01L 33/62* | (2010.01) |
| *H01L 25/075* | (2006.01) |

(Continued)

(52) U.S. Cl.
CPC ......... *F21S 43/195* (2018.01); *F21S 41/192* (2018.01); *F21S 41/663* (2018.01); *F21S 43/14* (2018.01); *F21S 43/33* (2018.01); *F21S 45/47* (2018.01); *H01L 33/62* (2013.01); *H01L 33/647* (2013.01); *F21S 41/147* (2018.01); *F21Y 2115/10* (2016.08); *H01L 25/0753* (2013.01); *H01L 33/08* (2013.01); *H01L 33/24* (2013.01)

(58) Field of Classification Search
None
See application file for complete search history.

(56) References Cited

U.S. PATENT DOCUMENTS

| | | |
|---|---|---|
| 2008/0290357 A1 | 11/2008 | Lin et al. |
| 2009/0261356 A1 | 10/2009 | Lee et al. |

(Continued)

FOREIGN PATENT DOCUMENTS

| | | |
|---|---|---|
| EP | 2 555 265 A2 | 2/2013 |
| FR | 3 011 388 | 4/2015 |

(Continued)

OTHER PUBLICATIONS

French Preliminary Search Report dated Nov. 7, 2017 in French Application 17 51283 filed on Feb. 17, 2017 (with English Translation of Categories of Cited Documents).

*Primary Examiner* — Vip Patel
(74) *Attorney, Agent, or Firm* — Oblon, McClelland, Maier & Neustadt, L.L.P.

(57) ABSTRACT

A light module, in particular for lighting and/or signalling, in particular for a motor vehicle, including a light source and a plurality of light-emitting units of submillimetric size, at least a first set of light-emitting units projecting from a first face of a first substrate; and, a first carrier designed to dissipate heat from the first set of light-emitting units, the first carrier being linked to a second face of the first substrate; wherein the first carrier is furthermore designed to form a first electrode of the first set of light-emitting units so as to conduct a current to the first set of light-emitting units.

16 Claims, 3 Drawing Sheets

(51) Int. Cl.
  *H01L 33/08* (2010.01)
  *H01L 33/24* (2010.01)
  *F21S 41/147* (2018.01)
  *F21Y 115/10* (2016.01)

(56) References Cited

U.S. PATENT DOCUMENTS

| | | |
|---|---|---|
| 2013/0037833 A1 | 2/2013 | Nam et al. |
| 2014/0027796 A1 | 1/2014 | Nam et al. |
| 2015/0129905 A1 | 5/2015 | Nam et al. |
| 2015/0194571 A1 | 7/2015 | Lee et al. |
| 2016/0013384 A1* | 1/2016 | Ting .................... H01L 25/0753 257/91 |
| 2016/0190388 A1 | 6/2016 | Lee et al. |
| 2016/0204323 A1 | 7/2016 | Nam et al. |
| 2016/0300881 A1 | 10/2016 | Bouvier et al. |

FOREIGN PATENT DOCUMENTS

| | | |
|---|---|---|
| FR | 3 039 881 | 2/2017 |
| JP | 2003-243718 | 8/2003 |

* cited by examiner

LIGHT MODULE WITH REDUCED BULK

BACKGROUND

I. Field of the Application

The invention concerns the field of lighting and/or signalling, in particular for motor vehicles.

It is applied in particular in front or rear lights, the body or the passenger compartment of a motor vehicle.

The light sources used in light modules for lighting and signalling in motor vehicles are increasingly commonly made up of light-emitting diodes, in particular to gain advantages in terms of bulk and of autonomy in comparison with conventional light sources. The use of light-emitting diodes in lighting and/or signalling modules has furthermore enabled market players (motor vehicle manufacturers and lighting and/or signalling module designers) to add a creative touch when designing these modules, in particular through the use of an ever-increasing number of these light-emitting diodes to produce optical effects.

However, it is necessary to dissipate the heat emitted by the light-emitting diodes.

II. Description of Related Art

To this end, the prior art discloses SMD (for "Surface Mounted Device") light-emitting diodes, which are mounted on a substrate of printed circuit board or IMS (for Insulated Metal Substrate) type, which substrate is itself mounted on a radiator designed to dissipate heat.

The various light-emitting diodes are connected electrically via connectors that are added to the printed circuit board that comprises all of the electrical tracks.

However, the use of connectors and an entire printed circuit board results in a significant bulk, and heat dissipation is restricted by the presence of the printed circuit board between the light-emitting diodes and the radiator.

In addition, such a solution requires taking into account the printed circuit board when mounting a reflector, and there is a risk of visible reflection of the printed circuit board by the reflector.

Another known solution consists in using a thermally conductive adhesive to bond a light-emitting diode directly onto a radiator, the current being routed via two wires that are soldered above the light-emitting diode and linked via a printed circuit board. It will be noted that such an adhesive is electrically conductive to a very small extent, or even insulating.

Such a solution still requires a complex printed circuit board with numerous electrical connections, and therefore a significant bulk for the light module.

BRIEF SUMMARY

The present invention improves the situation.

A first aspect of the invention relates to a light module, in particular for lighting and/or signalling, in particular for a motor vehicle, comprising:

a light source comprising a plurality of light-emitting units of submillimetric size, at least a first set of light-emitting units projecting from a first face of a first substrate;

a first carrier designed to dissipate heat from the first set of light-emitting units, the first carrier being linked to a second face of the first substrate. The first carrier is furthermore designed to form a first electrode of the first set of light-emitting units so as to conduct a current to the first set of light-emitting units.

The action of "conducting a first current to the first set of light-emitting units" covers both the operation of a cathode and the operation of an anode according to the invention. Thus, the first carrier performs either the cathode function or the anode function for the first set of light-emitting units.

The production of an electrode on the base of the light source is made possible through the use of a light source comprising light-emitting units of submillimetric size, which technology is also called monolithic light source. These light-emitting units may be in the form of rods of submillimetric size or studs submillimetric size. Specifically, according to such a technology, the cathode is situated directly on the base of the light source, and therefore the light source may be connected via its carrier.

The bulk resulting from the light module is thus reduced considerably through the combined use of the claimed carrier and of a monolithic light source.

According to one embodiment of the invention, the plurality of light-emitting units may furthermore comprise a second set of light-emitting units projecting from a first face of a second substrate.

The use of a plurality of sets of light-emitting units makes it possible to implement more complex lighting functions.

In addition, the first carrier may furthermore be linked to a second face of the second substrate and may furthermore be designed to form a first electrode of the second set of light-emitting units so as to conduct the current to the second set of light-emitting units, and the first substrate and the second substrate may furthermore be linked to respective second electrodes.

The first and second sets of light-emitting units may thus be electrically connected in parallel while at the same time using one and the same carrier, thus reducing the complexity and the bulk of the light module.

In addition, the second electrodes may be linked electrically to one and the same printed circuit board.

Just one wired connection is then necessary per set of light-emitting units, the wired connections being linked to one and the same printed circuit board, thereby making it possible to reduce the complexity and the bulk of the light module.

In addition, the printed circuit board and the first carrier may be linked mechanically.

Installation of the light module in a motor vehicle is thus facilitated.

For example, the printed circuit board may be overmoulded on the first carrier.

As a variant, the light module may furthermore comprise a second carrier linked to a second face of the second substrate, the second carrier furthermore being designed to form a first electrode of the second set of light-emitting units so as to conduct a current to the second set of light-emitting units, and the first carrier may furthermore be linked to a second electrode of the second set of light-emitting units.

The first and second sets of light-emitting units may thus be connected electrically in series, thereby reducing the bulk, in particular the number of wired connections, in comparison with a parallel connection.

In addition, the first carrier and the second carrier may be linked mechanically by an electrically insulating structural component.

Installation of the light module in a motor vehicle is thus facilitated.

For example, the structural component may be thermoplastic.

Furthermore, the structural component furthermore comprises piercings in order to dissipate heat.

The dissipation of heat by the light module is thus improved.

As a variant, the light module may furthermore comprise an optical element, the first carrier and the second carrier being linked mechanically by the optical element, the optical element being able to deflect light rays originating from the first set of light-emitting units and/or from the second set of light-emitting units.

The optical element thus performs both an optical and a mechanical function, thereby reducing the bulk of the light module.

In addition, the light module may furthermore comprise a switch, the switch linking the first carrier to the second electrode of the second set of light-emitting units and being able to selectively electrically link or separate the first carrier and the second electrode of the second set of light-emitting units.

Such an embodiment makes it possible to implement different lighting functions using a single light module.

As a variant, the first carrier may furthermore be embodied to deflect light rays originating from the first set of light-emitting units.

The carrier thus performs a carrier function, a radiator function and an optical function at the same time, thus reducing the bulk and the complexity of the light module.

A second aspect of the invention relates to a lighting device for a motor vehicle, comprising a light module according to the first aspect of the invention. The lighting device may be a vehicle front headlight, a vehicle rear light or an internal lighting element of the vehicle.

According to one embodiment, the lighting device may furthermore comprise an outer lens, and the lighting device may be positioned in the proximity of the outer lens.

A third aspect of the invention relates to a motor vehicle comprising a light module according to the first aspect of the invention and/or a lighting device according to the second aspect of the invention.

BRIEF DESCRIPTION OF THE DRAWINGS

Other features and advantages of the invention will emerge upon examining the following detailed description and the appended drawings, in which.

DETAILED DESCRIPTION

Figure 1:
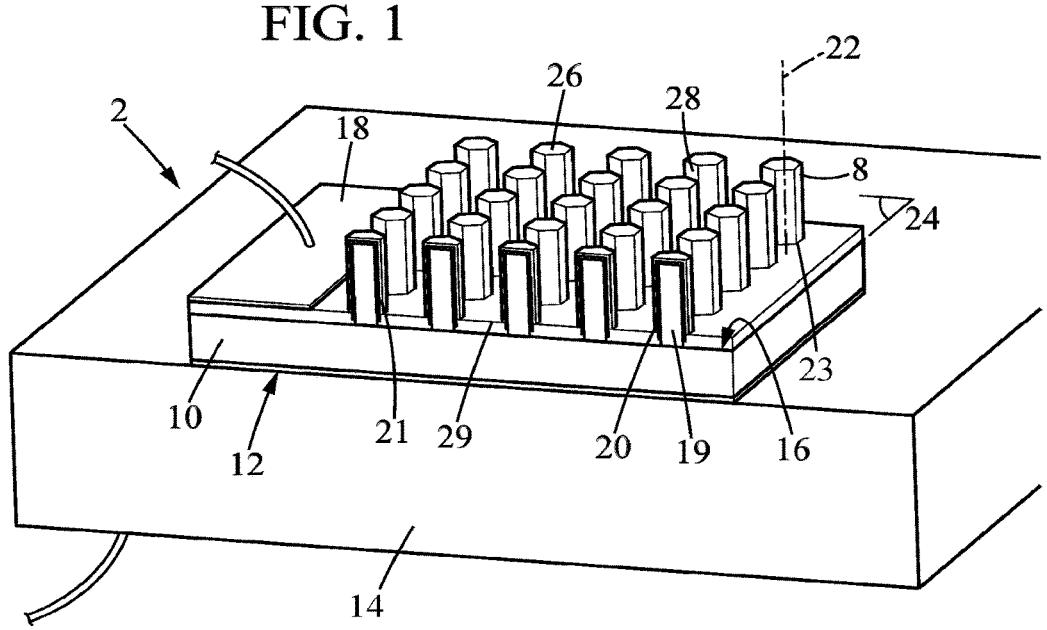
FIG. 1 illustrates a light module according to one embodiment of the invention.

FIG. 1 illustrates a light module 2 for lighting and/or signalling, in particular for a motor vehicle, according to one embodiment of the invention.

With reference to FIG. 1, the module 2 comprises an electroluminescent light source that comprises a plurality of light-emitting units 8 of submillimetric size. These light-emitting units take the form of rods, which will be called light-emitting rods hereinafter. Alternatively the light-emitting units can take the form of studs.

Figure 2:
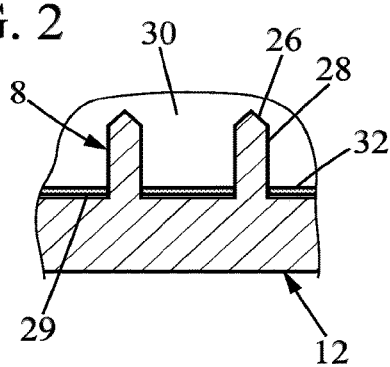
FIG. 2 illustrates a light source according to one embodiment of the invention.

In FIG. 2, the light-emitting rods are grouped into a first set of light-emitting rods. However, as illustrated hereinafter, the light source may comprise a plurality of sets of light-emitting rods. "Set of light-emitting rods" is the name given to a group of light-emitting rods that is able to be addressed individually, and therefore independently of the other groups.

The light-emitting rods 8 of the first set originate on one and the same substrate 10. Each light-emitting rod, formed in this case using gallium nitride GaN, extends perpendicularly, or substantially perpendicularly, projecting from the substrate, in this case produced based on silicon, with other materials, such as silicon carbide, being able to be used for the substrate without departing from the context of the invention. By way of example, the light-emitting rods could be produced from a compound based on aluminium nitride and gallium nitride AlGaN, or from a compound based on aluminium, indium and gallium.

In FIG. 1, the substrate 10 has a lower face 12, to which a first electrode 14 is applied, and an upper face 16, from which the light-emitting rods 8 project and to which a second electrode 18 is applied.

Various layers of material are stacked on the upper face 16, in particular after the light-emitting rods have grown from the substrate, achieved in this case by a bottom-up approach.

The first electrode 14 is advantageously a first carrier designed to dissipate heat from the first set of light-emitting rods.

Among these various layers may be found at least one layer of electrically conductive material, so as to allow the light-emitting rods to be supplied with electric power. This layer is etched in such a way as to link the rods of the electroluminescent light source 3 to one another.

The light-emitting rods of submillimetric size extend from the substrate and each include, as may be seen in FIG. 1, a core 19 made of gallium nitride, arranged around which are quantum wells 20 formed by a radial stacking of layers of different materials, in this case gallium nitride and gallium-indium nitride or aluminium-gallium-indium nitride, and a shell 21, also made of gallium nitride, surrounding the quantum wells.

Each light-emitting rod extends in a longitudinal axis 22 defining its height, the base 23 of each light-emitting rod being arranged in a plane 24 of the upper face 16 of the substrate 10.

The light-emitting rods 8 of the first set advantageously have the same shape. These rods are each delineated by an end face 26 and by a circumferential wall 28 that extends along the longitudinal axis. When the light-emitting rods are doped and subjected to polarization, the resulting light at the output of the electroluminescent light source is emitted mainly from the circumferential wall 28, it being understood that it may be provided that at least a small amount of light rays also exit from the end face 26. The result of this is that each rod acts as a single light-emitting diode, and that the density of the light-emitting rods 8 increases the luminance of the electroluminescent light source.

The circumferential wall 28 of a light-emitting rod 8, corresponding to the gallium nitride shell, is covered with a layer of transparent conductive oxide (TCO) 29 that forms the anode of each rod, complementary to the cathode formed by the substrate.

This circumferential wall 28 extends along the longitudinal axis 22 from the substrate 10 as far as the end face 26, the distance from the end face 26 to the upper face 16 of the substrate, from which the light-emitting rods 8 originate, defining the height of each light-emitting rod. By way of example, it may be provided that the height of a light-emitting rod 8 is between 1 and 10 micrometers, whereas it may be provided that the largest transverse dimension of the end face, perpendicular to the longitudinal axis 22 of the light-emitting rod in question, is less than 2 micrometers. It may also be provided to define the surface area of a rod, in a cross-sectional plane perpendicular to this longitudinal axis 22, to be within a range of defined values, and in particular between 1.96 and 4 square micrometers.

These dimensions, which are given by way of nonlimiting example, make it possible to differentiate a light source comprising light-emitting rods from a light source with planar light-emitting diodes.

Other particular sizes for the electroluminescent light source according to the invention may also be provided. The density of the rods and the surface area of the lighting surface may in particular be calculated such that the luminance achieved by the plurality of light-emitting rods is at least 60 $Cd/mm^2$, for example. It is understood that, when forming the rods 8, the height may be modified from one set of light-emitting rods to another in such a way as to boost the luminance of the electroluminescent light source when the height is increased. The height of the rods may also be modified within one and the same set of light-emitting rods, such that one group of rods may have a height different from another group of rods of another set of light-emitting rods.

The shape of the light-emitting rods 8 may also vary from one set of light-emitting rods to another, in particular in terms of the cross section of the rods and in terms of the shape of the end face 26. FIG. 1 illustrates light-emitting rods having a cylindrical general shape, and in particular with a polygonal cross section, more particularly hexagonal in this case. It is understood that it is important, for light to be able to be emitted through the circumferential wall, that the latter has a polygonal or circular shape, for example.

Moreover, the end face 26 may have a shape that is substantially planar and perpendicular to the circumferential wall, such that it extends substantially parallel to the upper face 16 of the substrate 10, as illustrated in FIG. 1, or else it may have a curved or pointed shape at its centre, so as to multiply the directions in which the light exiting this end face is emitted, as illustrated in FIG. 2.

The light-emitting rods 8 of the first set are arranged in a two-dimensional matrix in FIG. 1. This arrangement could be such that the light-emitting rods 8 are arranged in quincunx. The invention covers other distributions of the light-emitting rods, in particular having rod densities that may vary from one set of rods to another, and that may vary in different zones of one and the same set of rods.

The first set of light-emitting rods 8 may furthermore include, as illustrated in FIG. 2, a layer 30 of a polymeric material in which light-emitting rods 8 are at least partially embedded. The layer 30 may thus extend over the entire extent of the substrate, or only around a given group of light-emitting rods 8. The polymeric material, which may in particular be silicone-based, makes it possible to protect the light-emitting rods 8 without impairing the diffusion of the light rays. Furthermore, it is possible to integrate, into this layer 30 of polymeric material, wavelength conversion means, for example luminophores, that are able to absorb at least a portion of the rays emitted by one of the rods and to convert at least a portion of said absorbed excitation light into a light emission having a wavelength that is different from that of the excitation light.

The light source may furthermore include a coating 32 of light-reflective material that is arranged between the light-emitting rods 8 so as to deflect the rays, which are initially oriented towards the substrate, towards the end face 26 of the light-emitting rods 8. In other words, the upper face 16 of the substrate 10 may include a reflective means that returns the light rays, which are initially oriented towards the upper face 16, towards the output face of the light source. Rays that would otherwise be lost are thus recovered. This coating 32 is arranged between the light-emitting rods 8 on the layer of transparent conductive oxide 29.

Figure 3:
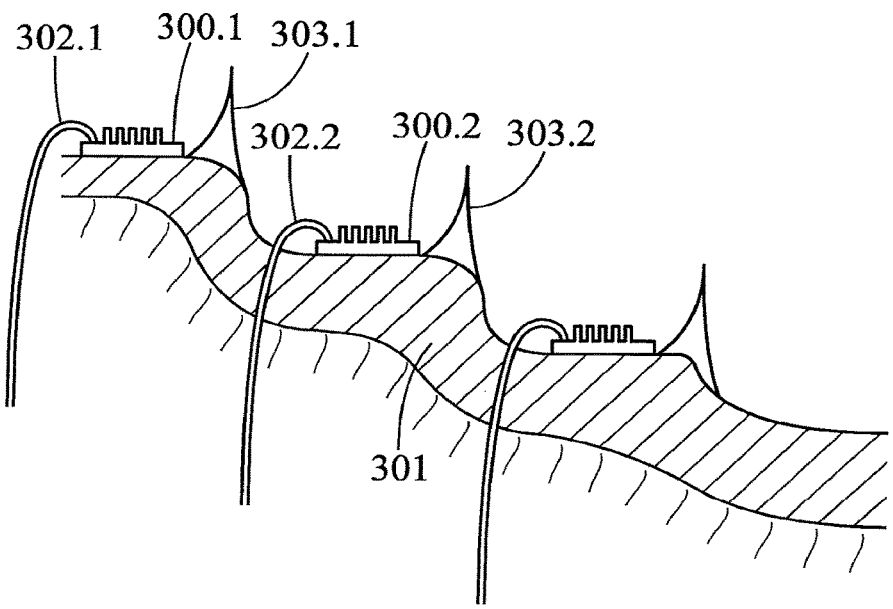
FIG. 3 illustrates a light module according to one embodiment of the invention.

FIG. 3 illustrates a light module according to one embodiment of the invention.

According to this embodiment, the light source comprises a plurality of sets of light-emitting rods, in particular a first set of light-emitting rods 300.1 and a second set of light-emitting rods 300.2.

A first carrier 301 is designed to dissipate heat from the first set of light-emitting rods 300.1, the first carrier being linked to a second face of the first substrate, such as the lower face 12 illustrated in FIG. 1. The first carrier 301 is furthermore designed to form a first electrode of the first set of light-emitting rods 301 so as to conduct a current to the first set of light-emitting rods.

The first carrier 301 thus corresponds to the first electrode 14 illustrated with reference to FIG. 1.

According to the embodiment of FIG. 3, the first carrier 301 is furthermore designed to form a first electrode of the second set of light-emitting rods 300.2 so as to conduct a current to the second set of light-emitting rods 300.2.

The first carrier 301 thus forms a cathode that is common to a plurality of sets of light-emitting rods of the light source. The first carrier 301 furthermore makes it possible to dissipate heat from the sets of light-emitting rods without increasing the bulk of the light module.

The light module may furthermore comprise second electrodes 302.1 and 302.2 that are linked to a first substrate of the first set of light-emitting rods 300.1 and to a second substrate of the second set of light-emitting rods 300.2, respectively.

The second electrodes 302.1 and 302.2 may then be linked electrically to one and the same printed circuit board, not shown in FIG. 3. The printed circuit board and the first carrier 301 may be linked mechanically. For example, the printed circuit board may be overmoulded on the first carrier 301, or the printed circuit board and the first carrier 301 may be overmoulded on another shared carrier.

The embodiment of FIG. 3 thus makes it possible to supply power to the sets of light-emitting rods 300.1 and 300.2 in parallel, with a smaller bulk in comparison to the prior art solutions.

The light emission module may additionally comprise at least one first optical element 303.1. The optical element 303.1 is able to deflect light rays originating from the first set 300.1 of light-emitting rods and/or from the second set 300.2 of light-emitting rods. The first optical element 303.1 may be linked mechanically to the first carrier 301, thereby making it possible to improve the accuracy associated with the function of the optical element 302.1. For example, the first optical element 303.1 may be mounted simply on the first carrier 301, such as by using any conventional fixing method involving crimping, clipping, screwing, laser welding or something else.

As a variant, the first optical element 303.1 is inseparable from the first carrier 301. It may in particular be integral with the carrier 301. For example, the first carrier 301 may be embodied to deflect light rays originating from the first set 301.1 of light-emitting rods and/or from the second set 301.2 of light-emitting rods.

A second optical element 303.2 is shown in FIG. 3.

There is no restriction attached to the optical elements 303.1 and 303.2, which may be simple optical elements or optical elements having a plurality of cavities, reflectors, lenses or something else.

Figure 4:
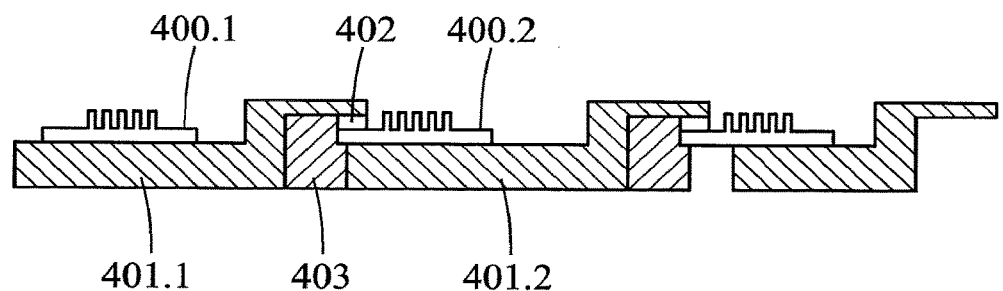
FIG. 4 illustrates a light module according to one embodiment of the invention.

FIG. 4 illustrates a light module according to one embodiment of the invention.

In comparison with the embodiment of FIG. 3, FIG. 4 proposes connecting sets of light-emitting rods in series.

As in FIG. 3, the light module shown in FIG. 4 comprises a plurality of sets of light-emitting rods, namely a first set 400.1 of light-emitting rods and a second set 400.2 of light-emitting rods.

A first carrier 401.1 is designed to dissipate heat from the first set of light-emitting rods, the first carrier being linked to a second face of a first substrate of the first set 400.1 of light-emitting rods, such as the lower face 12 shown in FIG. 1.

The first carrier 401.1 is furthermore designed to form a first electrode of the first set 400.1 of light-emitting rods so as to conduct a current to the first set 400.1 of light-emitting rods.

In a manner similar to the first carrier 401.1, a second carrier 401.2 is dedicated to the second set 400.2 of light-emitting rods.

A structural component 403 may mechanically link the first carrier 401.1 and the second carrier 401.2. The structural component 403 is electrically insulating, and may also be thermally insulating. The structural component 403 may be made of a thermoplastic material and may comprise piercings in order to dissipate heat.

As illustrated in FIG. 4, each carrier links the anode of a set of light-emitting rods to the cathode of the following set of light-emitting rods. To this end, a connecting element 402 may serve as an electrical junction between the first carrier 401.1 and the anode of the second set 400.2 of light-emitting rods.

Such an assembly makes it possible to avoid using any wired electrical connection, thus reducing the bulk of the light module.

As for the embodiment of FIG. 3, the light module of FIG. 4 may incorporate optical elements, not shown in FIG. 4.

Figure 5:
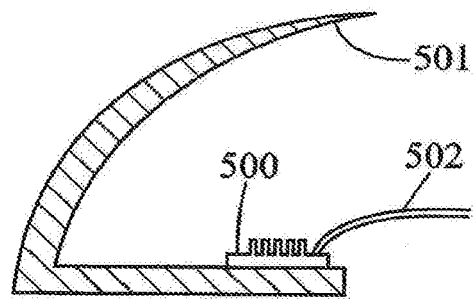
FIG. 5 illustrates a light module according to one embodiment of the invention.

FIG. 5 shows a light module according to one embodiment of the invention.

The light module comprises a first set of light-emitting rods 500 and a first carrier 501 designed to dissipate heat from the first set of light-emitting rods, the first carrier being linked to a second face of a substrate of the first set of light-emitting rods. The first carrier 501 is furthermore designed to form a first electrode of the first set 500 of light-emitting rods so as to conduct a current to the first set of light-emitting rods. A second electrode is linked to a wired connection 502.

The first carrier 501 is furthermore embodied to deflect light rays originating from the first set of light-emitting rods. The first carrier 501 thus has the role of a reflector in addition to its role of an electrode or a radiator, thereby making it possible to considerably reduce the bulk and the complexity of the light module.

The embodiment of FIG. 5 may be combined with the embodiment of FIG. 3 or of FIG. 4 in order to incorporate a plurality of sets of light-emitting rods into the light source of the light module.

Figure 6:
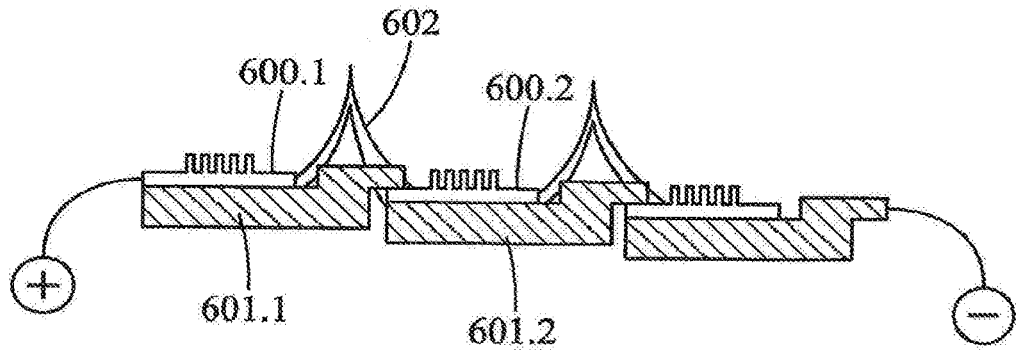
FIG. 6 illustrates a light module according to one embodiment of the invention.

FIG. 6 shows a light module according to one embodiment of the invention.

The light module comprises at least a first set 600.1 of light-emitting rods and a second set 600.2 of light-emitting rods.

As for the embodiment illustrated in FIG. 4, a first carrier 601.1 is designed to dissipate heat from the first set 600.1 of light-emitting rods, the first carrier 601.1 being linked to a second face of a substrate of the first set 600.1 of light-emitting rods, and a second carrier 601.2 is designed to dissipate heat from the second set 600.2 of light-emitting rods, the second carrier 601.2 being linked to a second face of a substrate of the second set 600.2 of light-emitting rods. The first carrier 601.1 is furthermore designed to form a first electrode of the first set 600.1 of light-emitting rods so as to conduct a current to the first set 600.1 of light-emitting rods, and the second carrier 601.2 is furthermore designed to form a first electrode of the second set 600.2 of light-emitting rods so as to conduct a current to the second set 600.2 of light-emitting rods. With the sets of light-emitting rods being linked in series, the first carrier 601.1 is furthermore linked to the anode of the second set 601.2 of light-emitting rods.

The light module furthermore comprises an optical element 602. According to the embodiment of FIG. 6, the optical element 602 mechanically links the first carrier 601.1 to the second carrier 601.2, thereby making it possible to avoid adding the structural component 403 illustrated in FIG. 4. For example, the optical element 602 may be mounted simply on the first carrier 601.1 and on the second carrier 601.2, such as by using any conventional fixing method involving crimping, clipping, screwing, laser welding or something else.

Figure 7:
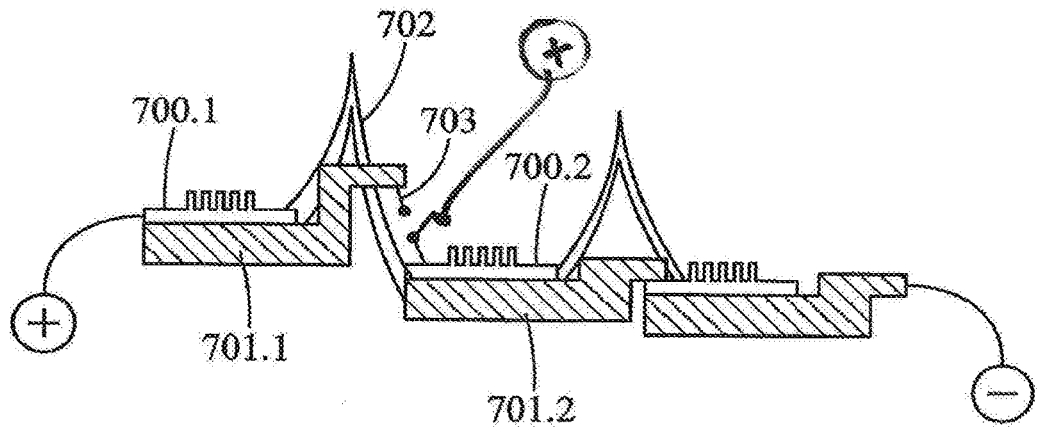
FIG. 7 illustrates a light module according to one embodiment of the invention.

FIG. 7 shows a light module according to one embodiment of the invention.

The light module comprises a first set 700.1 and a second set 700.2 of light-emitting rods, a first carrier 701.1, a second carrier 701.2 and an optical element 702 that are linked in the same way as that shown with reference to FIG. 6. However, unlike the embodiment shown with reference to FIG. 6, a switch 703 links the first carrier 701.1 to the second electrode of the second set 700.2 of light-emitting rods and is able to selectively electrically link or separate the first carrier 701.1 and the second electrode of the second set 700.2 of light-emitting rods.

The switch 703 may be formed by a transistor-based assembly, for example. The use of a switch is particularly advantageous when a plurality of lighting functions are implemented by the light module, or in order to independently control sets of light-emitting rods in spite of their series connection. The switch 703 thus makes it possible to separate the various functions performed by the light module. As an alternative to the use of a switch, the invention may provide for electrical insulation between the sets of light-emitting rods performing different functions. The electrical circuits to be produced for selecting a lighting function are well known to those skilled in the art and are not described further.

The carriers for the light modules disclosed above may advantageously be positioned in the proximity of an outer lens of the headlamp or headlight in order to create a warmer zone and therefore reduce the effects of condensation on this headlamp.

In addition, the use of a carrier such as described with reference to the figures makes it possible to use such carriers as electromagnetic grounding, in particular in the context of the use of pulsed LEDs. The carriers may thus perform a shielding function for protecting the vehicles from emissions from sources that are fixed thereto and that could potentially be disruptive, in particular in the case where the sources are supplied with power by pulsed currents.

Of course, the invention is not limited to the embodiments described above and provided only by way of example. It encompasses numerous modifications, alternative forms and other variants able to be contemplated by those skilled in the art within the context of the present invention, and in particular any combination of the various embodiments described above.

The invention claimed is:

1. A light module, for lighting and/or signalling, for a motor vehicle, comprising:
    a light source comprising a plurality of light-emitting units of submillimetric size, at least a first set of light-emitting units projecting from a first face of a first substrate;
    a first carrier dissipates heat from the first set of light-emitting units, said first carrier is adjacent to a second face of the first substrate; wherein said first carrier is an electrode conducting an electrical current to the first set of light-emitting units.

2. The light module according to claim 1, wherein the plurality of light-emitting units furthermore comprises a second set of light-emitting units projecting from a first face of a second substrate.

3. The light module according to claim 2, wherein the first carrier is adjacent to a second face of the second substrate and is the electrode conducting the current to the second set of light-emitting units,
    wherein the first substrate and the second substrate include electrical connections to respective second electrodes.

4. The light module according to claim 3, wherein the second electrodes are electrically connected to a single printed circuit board.

5. The light module according to claim 4, wherein the printed circuit board and the first carrier are mechanically connected.

6. The light module according to claim 5, wherein the printed circuit board is overmolded on the first carrier.

7. The light module according to claim 2, furthermore comprising a second carrier adjacent to a second face of the second substrate, said second carrier is another electrode conducting the current to the second set of light-emitting units,
    wherein the first carrier is electrically connected to a second electrode on the second substrate of the second set of light-emitting units.

8. The light module according to claim 7, wherein the first carrier and the second carrier are linked mechanically by an electrically insulating structural component.

9. The light module according to claim 8, wherein the structural component is thermoplastic.

10. The light module according to claim 8, wherein the structural component includes piercings in order to dissipate heat.

11. The light module according to claim 7, furthermore comprising at least one optical element, wherein the first carrier and the second carrier are mechanically connected by said optical element, said optical element conducts light rays originating from the first set of light-emitting units and/or from the second set of light-emitting units.

12. The light module according to claim 11, furthermore comprising a switch, said switch connecting the first carrier to the second electrode of the second set of light-emitting units and selects between electrically connecting and disconnecting the first carrier and the second electrode of the second set of light-emitting units.

13. The light module according to claim 1, wherein the first carrier conducts light rays originating from the first set of light-emitting units.

14. A lighting device for a motor vehicle, comprising the light module of claim 1.

15. The light module according to claim 9, wherein the structural component includes piercings in order to dissipate heat.

16. The lighting device for a motor vehicle, comprising the light module of claim 2.

* * * * *